(12) United States Patent
Schloesser et al.

(10) Patent No.: US 9,450,085 B2
(45) Date of Patent: Sep. 20, 2016

(54) SEMICONDUCTOR DEVICE AND METHOD FOR PRODUCING A SEMICONDUCTOR DEVICE

(71) Applicant: Infineon Technologies AG, Neubiberg (DE)

(72) Inventors: Till Schloesser, Munich (DE); Andreas Meiser, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/548,375

(22) Filed: Nov. 20, 2014

(65) Prior Publication Data
US 2015/0137226 A1    May 21, 2015

(30) Foreign Application Priority Data

Nov. 21, 2013 (DE) .......... 10 2013 112 887

(51) Int. Cl.
| | |
|---|---|
| *H01L 29/78* | (2006.01) |
| *H01L 29/10* | (2006.01) |
| *H01L 29/66* | (2006.01) |
| *H01L 29/06* | (2006.01) |
| *H01L 29/08* | (2006.01) |
| *H01L 29/417* | (2006.01) |

(52) U.S. Cl.
CPC ....... *H01L 29/7813* (2013.01); *H01L 29/0634* (2013.01); *H01L 29/0878* (2013.01); *H01L 29/66734* (2013.01); *H01L 29/0696* (2013.01); *H01L 29/1095* (2013.01); *H01L 29/41766* (2013.01)

(58) Field of Classification Search
CPC .............. H01L 29/7813; H01L 29/42368; H01L 29/66734
See application file for complete search history.

(56) References Cited

U.S. PATENT DOCUMENTS

| | | |
|---|---|---|
| 2006/0131644 A1 | 6/2006 | Saito et al. |
| 2007/0018243 A1 | 1/2007 | Ono et al. |
| 2008/0017897 A1 | 1/2008 | Saito et al. |
| 2009/0057713 A1 | 3/2009 | Hirler |
| 2009/0108303 A1 | 4/2009 | Pfirsch |
| 2010/0159649 A1* | 6/2010 | Parthasarathy et al. ...... 438/138 |
| 2010/0314682 A1 | 12/2010 | Yilmaz et al. |
| 2011/0248335 A1* | 10/2011 | Higashida ............. 257/329 |
| 2011/0287617 A1* | 11/2011 | Kodama ............. 438/527 |
| 2012/0168856 A1 | 7/2012 | Luo et al. |
| 2012/0211833 A1* | 8/2012 | Tamura et al. ............. 257/339 |
| 2012/0326227 A1* | 12/2012 | Burke et al. ............. 257/330 |

(Continued)

FOREIGN PATENT DOCUMENTS

JP    2004241768 A1    8/2004

*Primary Examiner* — Fernando L Toledo
*Assistant Examiner* — Neil Prasad
(74) *Attorney, Agent, or Firm* — Eschweiler & Associates, LLC

(57) ABSTRACT

A semiconductor device includes a semiconductor substrate having first regions of a first conductivity type and body regions of the first conductivity type, which are arranged in a manner adjoining the first region and overlap the latter in each case on a side of the first region which faces a first surface of the semiconductor substrate, and having a multiplicity of drift zone regions arranged between the first regions and composed of a semiconductor material of a second conductivity type, which is different than the first conductivity type. The first regions and the drift zone regions are arranged alternately and form a superjunction structure. The semiconductor device further includes a gate electrode formed in a trench in the semiconductor substrate.

20 Claims, 15 Drawing Sheets

(56) References Cited

U.S. PATENT DOCUMENTS

| | | |
|---|---|---|
| 2013/0026560 A1 | 1/2013 | Onishi et al. |
| 2013/0299900 A1 | 11/2013 | Anderson et al. |
| 2013/0323921 A1* | 12/2013 | Burke ............... H01L 21/02164 438/589 |
| 2015/0008517 A1* | 1/2015 | Mauder et al. ............... 257/334 |
| 2015/0035002 A1* | 2/2015 | Weber ........................... 257/139 |

* cited by examiner

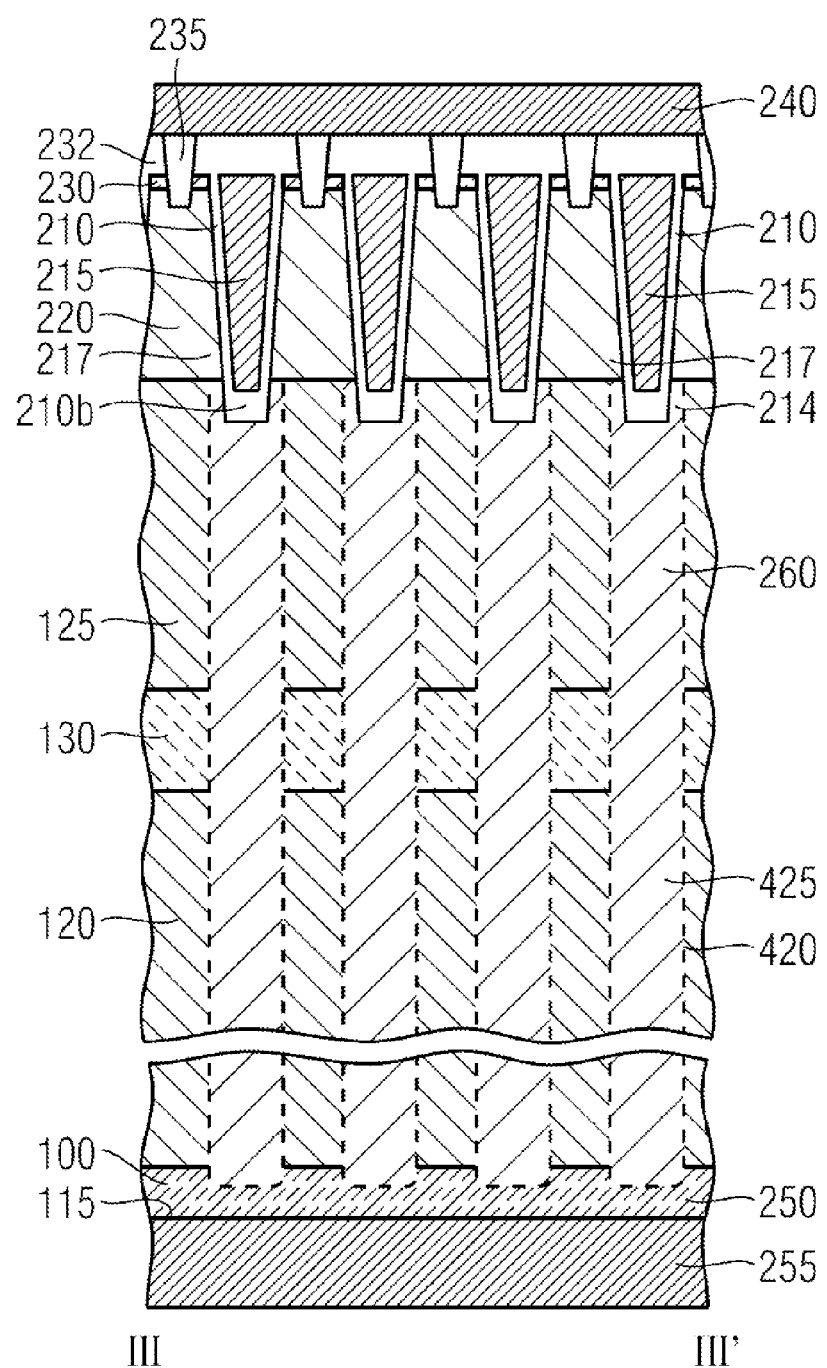

SEMICONDUCTOR DEVICE AND METHOD FOR PRODUCING A SEMICONDUCTOR DEVICE

CROSS REFERENCE TO RELATED APPLICATIONS

This application claims priority to German Patent Application number 102013112887.4, filed on Nov. 21, 2013 and is hereby incorporated in its entirety.

FIELD

The present disclosure relates to a semiconductor device and to a method for producing a semiconductor device.

BACKGROUND

Power MOSFETs (Metal Oxide Semiconductor Field Effect Transistors) are examples of semiconductor devices which are used for switching power or energy sources, inverter devices or the like. By way of example, these MOSFETs are designed to switch high voltages in the case of low-impedance loads, such that there is a very small switching and conduction loss and thus a low area-specific on resistance $R_{on}* A$, where A denotes the area required for the power MOSFET. At the same time, a high breakdown voltage should be present in power MOSFETs in the switched-off state. Depending on the voltage class, a power MOSFET in the switched-off state withstands a drain-source voltage VDS of a few tens to a few hundreds of volts, for example 300 to 800 volts. Furthermore, power MOSFETs should conduct a very high current which can be up to a few hundred amperes at a gate-source voltage of approximately 10 to 20 V under a low voltage drop VDS.

In order to satisfy the increasing demands for a low $R_{on}*A$ and a high breakdown voltage, it is desirable to develop new concepts for a semiconductor device, for example a vertical semiconductor device. Examples of such semiconductor devices are found in IP.COM-publication No. IPCOM000010537D (Jan. 23, 2003) "Trench DMOS für Kompensationsbauelemente" by O. Häberlen and M. Rüb (http://ip.com/IPCOM/000010537).

BRIEF DESCRIPTION OF THE DRAWINGS

The accompanying drawings are enclosed in order to afford a further understanding of exemplary embodiments of the disclosure, and they are included in the disclosure and form part thereof. The drawings illustrate exemplary embodiments of the present disclosure and together with the description serve for elucidating the principles. Other exemplary embodiments of the disclosure and a great many of the intended advantages are immediately acknowledged since they can be better understood with reference to the following detailed description. The elements in the drawings are not necessarily true to scale relative to one another. Identical reference signs indicate correspondingly similar parts.

FIGS. 2A to 2D show cross-sectional views of a further configuration of a semiconductor device;

DETAILED DESCRIPTION

Figure 1A:
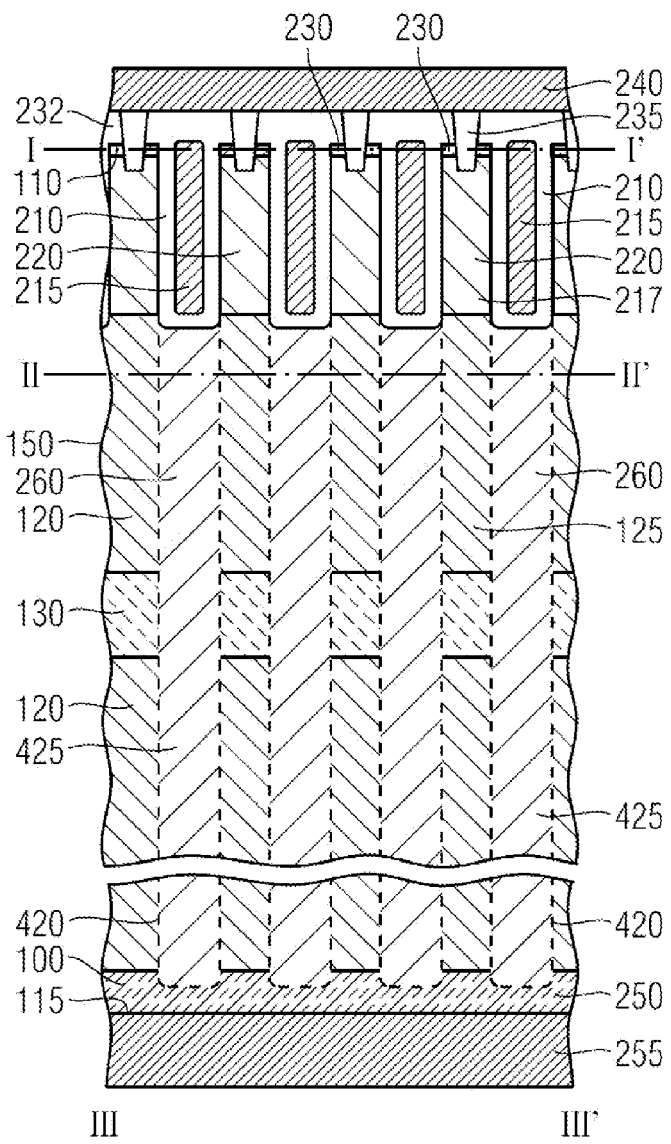
FIGS. 1A to 1D show different cross-sectional views of a semiconductor device in accordance with one embodiment.

In the following detailed description, reference is made to the accompanying drawings, which form part of the disclosure and show for illustration purposes specific example embodiments in which the disclosure can be implemented. In this regard, direction terminology such as "at the top", "at the bottom", "at the front", "at the back", "leading", "trailing", etc. is used with reference to the orientation of the figures just described. Since component parts of example embodiments of the present disclosure can be positioned in a number of different orientations, the direction terminology is used for illustration purposes and not restrictively in any way whatsoever. It should be understood that other example embodiments can be used and structural or logical changes can be made, without departing from the scope of the present disclosure. Therefore, the following detailed description should not be interpreted in any restrictive sense, and the scope of the present disclosure is defined by the appended patent claims.

The terms "substrate" or "semiconductor substrate" which are used in the following description encompass any structure which is based on a semiconductor and which has a semiconductor surface. Substrate and structure should be understood such that they encompass silicon, silicon on insulator (SOI), silicon on sapphire (SOS), doped and undoped semiconductors, epitaxial layers of silicon which are supported by a basic or base semiconductor layer, and other semiconductor structures. By way of example, the "substrate" or "semiconductor substrate" can be a monocrystalline material. The semiconductor need not be based on silicon. The semiconductor can likewise be silicon carbide, silicon-germanium, germanium, gallium nitride or gallium arsenide. In the context of the present disclosure, the term semiconductor substrate encompasses in particular a construction that arises if trenches are etched into a monocrystalline semiconductor layer and said trenches are subsequently filled with semiconductor material.

In the present disclosure, reference is made to doped parts, such as, for example, doped parts of a first or of a second conductivity type. As should clearly be understood, the terms "first" and "second" conductivity type can relate to n- or p-doped semiconductor parts, or vice versa. These parts can be formed by generally known doping methods by means of dopants such as, for example, As, P, S, Sb as an n-type dopant for silicon material. Examples of a p-type dopant for silicon material include B, Al or In.

In the present description, a current path is described at some points. Said current path indicates a path along which a current flow can take place, independently of the actual direction of the current flow.

The expressions "coupled" and/or "electrically coupled" used herein do not require a direct coupling, but rather permit elements between the "coupled" or "electrically coupled" elements. The expression electrically connected is intended to indicate a low-impedance electrical connection between the elements electrically connected to one another.

The description describes a semiconductor device which can be operated, for example, as an individual device. However, it can also be integrated with further component parts, for example logic component parts, in order to form an integrated circuit.

FIG. 1A shows a cross-sectional view of a semiconductor device in accordance with one embodiment. The cross-sectional view shown in FIG. 1A is established between III and III' as is illustrated for example in FIG. 1B. The semiconductor device shown in FIG. 1A comprises a semiconductor substrate 150. The semiconductor substrate 150 contains first regions 120 of a first conductivity type and body regions 220 of the first conductivity type. In this case, the body region 220 is arranged in each case on a side of the region 120 which faces a first surface 110 of the semiconductor substrate 150, and adjoins the region 120. The semiconductor device furthermore comprises a multiplicity of drift zone regions 260 which are arranged in the first surface 110 of the substrate 150. The drift zone regions 260 extend in a first direction having a component perpendicular to the first surface 110. By way of example, the drift zone regions 260 extend perpendicularly to the first surface 110. In accordance with one interpretation, the semiconductor substrate 150 thus contains webs 125 and a multiplicity of drift zone regions 260 arranged between the webs. The webs 125 in each case contain the first region 120 of the first conductivity type and the body region 220.

The body regions 220 overlap the first regions 120. That is to say that the body regions 220 are positioned in a horizontal direction such that body region 220 and first region lie vertically one above another, that is to say that a line running perpendicularly to the substrate surface intersects both regions. In accordance with one configuration, body regions 220 and first regions 120 can completely overlap or substantially completely overlap at their interface. If the regions completely overlap, more than 99 to 100% of the horizontal extent of the body region 220 lies above the first region at the interface. In the case of substantially complete overlapping, the body region 220 lies above the first region at the interface over approximately 85 to 99% of the horizontal extent of said body region, that is to say that the body region 220 can be horizontally displaced by approximately 1 to 15% relative to the first region. Regions can taper or widen with increasing distance from the interface. The above definition of the overlapping relates in each case to the overlapping at the interface. In the context of the present description, the expression "horizontally offset" means that the overlapping is minimal, for instance less than 5% of the interface, and that the horizontal overlapping is caused predominantly by production-dictated fluctuations.

The drift zone regions 260 contain monocrystalline or epitaxially grown semiconductor material 425 of a second conductivity type. In this case, the second conductivity type is different than the first conductivity type. By way of example, the first conductivity type can be p-conducting and the second conductivity type can be n-conducting. The semiconductor material 425 forms the drift zone of the power MOSFET. In accordance with one embodiment, the first regions 120 and the body regions 220 overlapping the first regions 120, and the drift zone regions can be formed by drift zone trenches 420 being formed in a semiconductor substrate and the semiconductor substrate being doped differently. By way of example, the drift zone regions 260 can be formed by monocrystalline semiconductor material 425 being introduced in the drift zone trenches 420. With corresponding production of the drift zone regions 260, the latter have a corresponding cross section with sidewall running approximately rectilinearly, for example. Alternatively, the sidewall can also be curved. The sidewall can correspond for example to a sidewall which can be defined by an etching process. The first regions 120 of the first conductivity type and the drift zone regions 260 composed of semiconductor material of the second conductivity type are arranged alternately with respect to one another and form a superjunction structure.

The semiconductor device furthermore contains a gate electrode arranged adjacent to the body region 220. As illustrated in FIG. 1A, the gate electrode 215 is electrically insulated from the body region 220 by a gate dielectric 210. The gate electrode 215 is arranged in a trench formed in the semiconductor substrate 150. In accordance with one embodiment, the gate electrode 215 can be formed in a self-aligned manner with respect to the drift zone regions 260. By way of example, the gate electrode 215 can be aligned in a horizontal direction with respect to the drift zone region 260, such that it is arranged directly above the drift zone region 260. By way of example, the drift zone regions are formed by the formation of drift zone trenches 420. The gate electrode 215 is arranged in each case in the upper region of the drift zone trenches 420, and the semiconductor material 425 of the second conductivity type is arranged in a lower region of the drift zone trenches 420. In this case, every position in the lower region of the drift zone trench is at a greater distance from the first surface 110 than an arbitrary position in the upper region of the drift zone trench 420. By way of example, an upper drift zone trench region can be a part which adjoins the body region 220. A lower part of the drift zone trench corresponds to a part adjacent to a drain region 250.

The semiconductor device furthermore comprises the drain region 250, which is electrically connected to the semiconductor material 425 of the second conductivity type in the drift zone trenches 420. The drift zone regions 260 adjoin the drain region 250. By way of example, the drain region 250 can adjoin a second surface 115 of the semiconductor substrate. The drain region 250 can be of the second conductivity type, for example.

The semiconductor device shown in FIG. 1A furthermore comprises source regions 232, which are formed in a manner adjoining the first surface 110 of the semiconductor substrate 150. The source regions 232 are of the second conductivity type, for example. The source regions 232 are electrically connected via source contacts 235 to a metallization layer, which forms the source electrode 240. As illustrated in FIG. 1A, the source contacts 235 can be configured in such a way that they extend right into the body region 220. In this case, the source contacts 235 additionally ensure contact between the body region 220 and the source electrode 240 which substantially suppresses a parasitic bipolar transistor that might otherwise form at this location.

Furthermore, a rear-side metallization is provided on the second surface 115 of the semiconductor substrate 150, said metallization forming the drain electrode 255.

The semiconductor device can furthermore contain a more highly doped region 130 embedded into the region of the first conductivity type. The more highly doped region 130 is of the first conductivity type and has a higher dopant concentration than the adjoining region 120. The region 130 can form a kind of "predetermined breaking location", for example, at which the avalanche breakdown takes place if an avalanche breakdown occurs. The region 130 can have a dopant concentration increased by approximately 20 to 30% compared with the region 120.

In accordance with one configuration, the region 130 can be embedded in such a way that it is present only in the inner region of the cell array, while no region 130 is provided in the edge region.

If the semiconductor device illustrated in FIG. 1A is switched on by a suitable gate voltage being applied, a conducting inversion layer forms at the interface between the body region 220 and the gate dielectric 210. A conducting channel thus forms in a channel region 217, which corresponds to a part of the body region or of the first region 120 at the interface with the gate dielectric 210. The channel region 217 is furthermore arranged adjacent to the conducting material 425 in the drift zone trenches 420. The channel region 217 substantially completely overlaps the first region 120. The channel region 217 is arranged horizontally offset with respect to the drift zone trenches 420.

Correspondingly, the transistor is in a conducting state from the source region 232 to the drain region 250 via the drift zone region 260. Upon switch-off, no inversion layer forms and thus no conducting channel forms at the interface with the gate dielectric 210. Furthermore, charge carriers in the drift zone region 260 are compensated for by charge carriers of the first conductivity type from the webs 125. Consequently, the drift zone region 260 is depleted of charge carriers, which leads to a blocking of a current flow at a high breakdown voltage. In this case, the doping of the semiconductor material 425 within the drift zone region 260 is dimensioned depending on the doping concentration of the first region 120 such that the charge carriers within the drift zone region 260 are compensated for. The semiconductor device described thus constitutes a superjunction component. The on resistance conversely depends directly on the number of charge carriers within the drift zone region 260. By increasing the number of charge carriers in the drift zone region 260 by setting the dopant concentration to a value that can still be compensated by the charge carriers within the first region 120 it is thus possible to obtain a reduction of $R_{on}*A$, without the breakdown strength of the semiconductor device being impaired.

In the case of the geometry illustrated, the drift zone trenches 420 can be arranged with a small spacing. Furthermore, a high density of gate electrodes can be achieved with the geometry illustrated, as a result of which a lower resistance of the semiconductor device is realized.

A multiplicity of drift zone regions 260 are formed between the first regions 120 of the first conductivity type. The drift zone regions 260 can extend in a second direction parallel to the first surface 110, i.e. perpendicularly to the direction of the illustrated cross section from FIG. 1A. They can be embodied in the form of strips. Alternatively, however, they can also be embodied as holes or as expanded holes. By way of example, the drift zone regions can have a circular or a polygonal cross section. Arbitrary arrangements of the holes are conceivable, for example a hexagonal arrangement of the holes.

In the case of the arrangement shown in FIG. 1A, a multiplicity of base transistors are connected in parallel with one another. FIG. 1A thus shows an excerpt from a cell array of a multiplicity of transistors connected in parallel. As mentioned above, the more highly doped region 130 can be formed in the inner region of the cell array, while no region 130 is present in the edge region of the cell array.

Figure 1B:
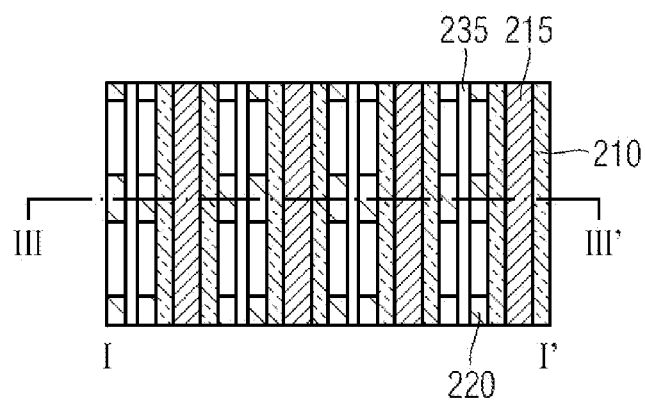

FIG. 1B shows a cross-sectional view established parallel to the first surface 110 at the position I-I' as illustrated in FIG. 1A. In the view illustrated in FIG. 1B, the gate electrodes 215 run in the form of strips. The source contacts 235 are likewise embodied in the form of strips and run parallel to the gate electrodes 215. At the first surface 110, strips of source regions 232 and body regions 220 are arranged alternately with respect to one another. In this case, the strips respectively of the source regions 230 and of the body regions 220 extend perpendicularly to the gate electrodes 215.

Figure 1C:
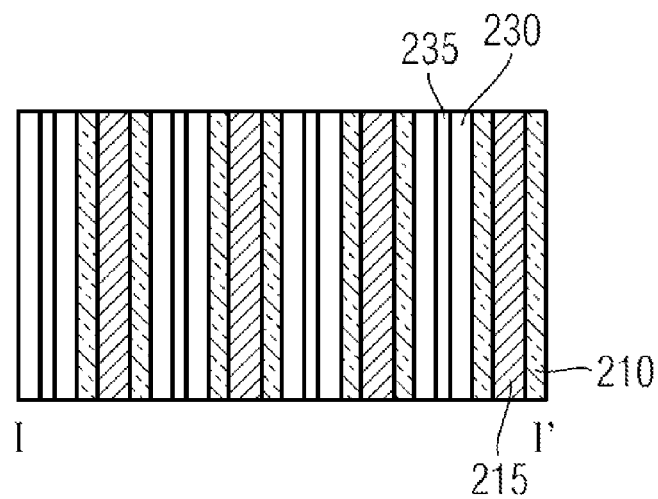

In accordance with a further configuration, as shown in FIG. 1C, the body regions 220 can also be formed such that they do not adjoin the first surface 110. As shown in FIG. 1A, the source contacts 235 extend right into the body region 220, such that it is possible to suppress the parasitic transistor even if the body regions 220 do not extend to the first surface 110 and thus to the source electrode 240.

Figure 1D:
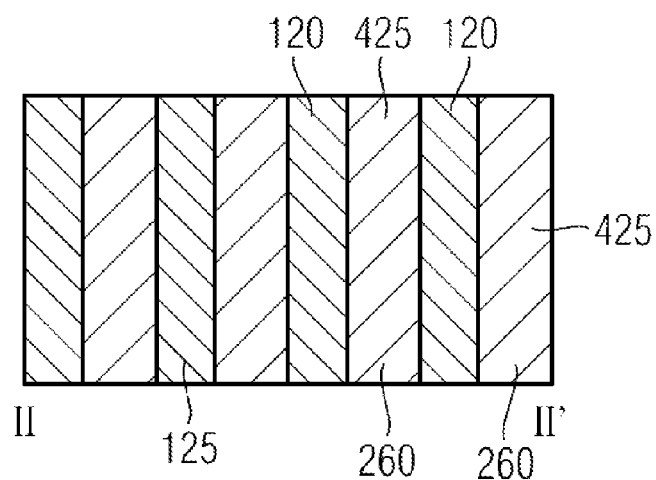

FIG. 1D shows a cross-sectional view established between II and II' as illustrated in FIG. 1A. As can be seen, drift zone regions 260 are arranged alternately with respect to semiconductor webs 125. In the arrangement shown in FIG. 1D, the drift zone regions 260 are formed in a striplike fashion. The drift zone regions 260 are formed by semiconductor material 425 of the second conductivity type.

Figure 2A:
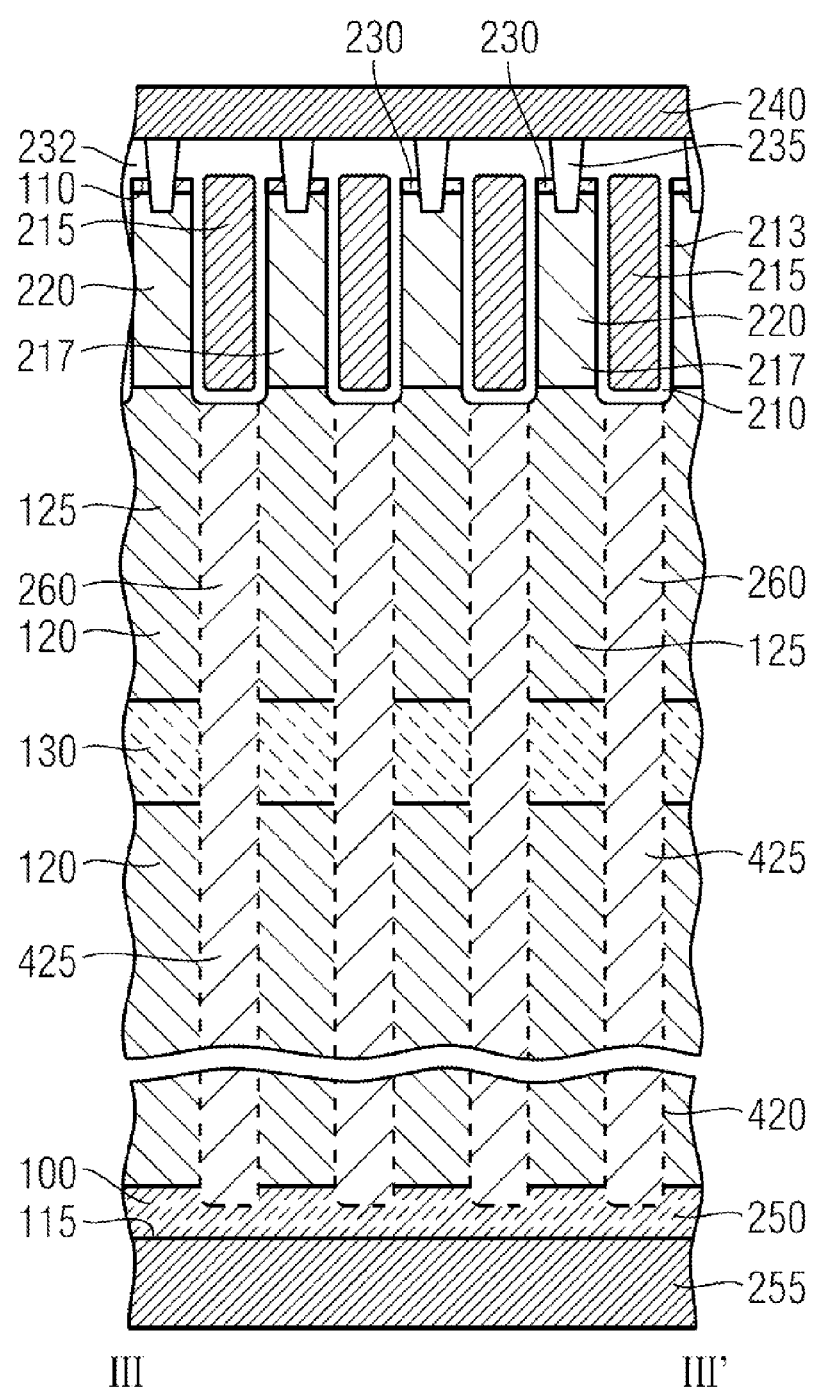

FIG. 2A shows a further embodiment, wherein the trench region 213 in which the gate electrode 215 is arranged has a larger width than the drift zone region 260. In accordance with this embodiment, the gate resistance can be reduced on account of the larger diameter of the gate electrode 215. Furthermore, the width of the body region 220 can be reduced to an extent such that, in the switched-on state of the transistor, the depletion zones that respectively form at the interface between body region 220 and gate electrode contact one another. Correspondingly, the transistor can be operated in a so-called fully depleted state in which the sub-threshold slope of the transistor is optimized, thus resulting in advantageous effects.

Figure 2B:
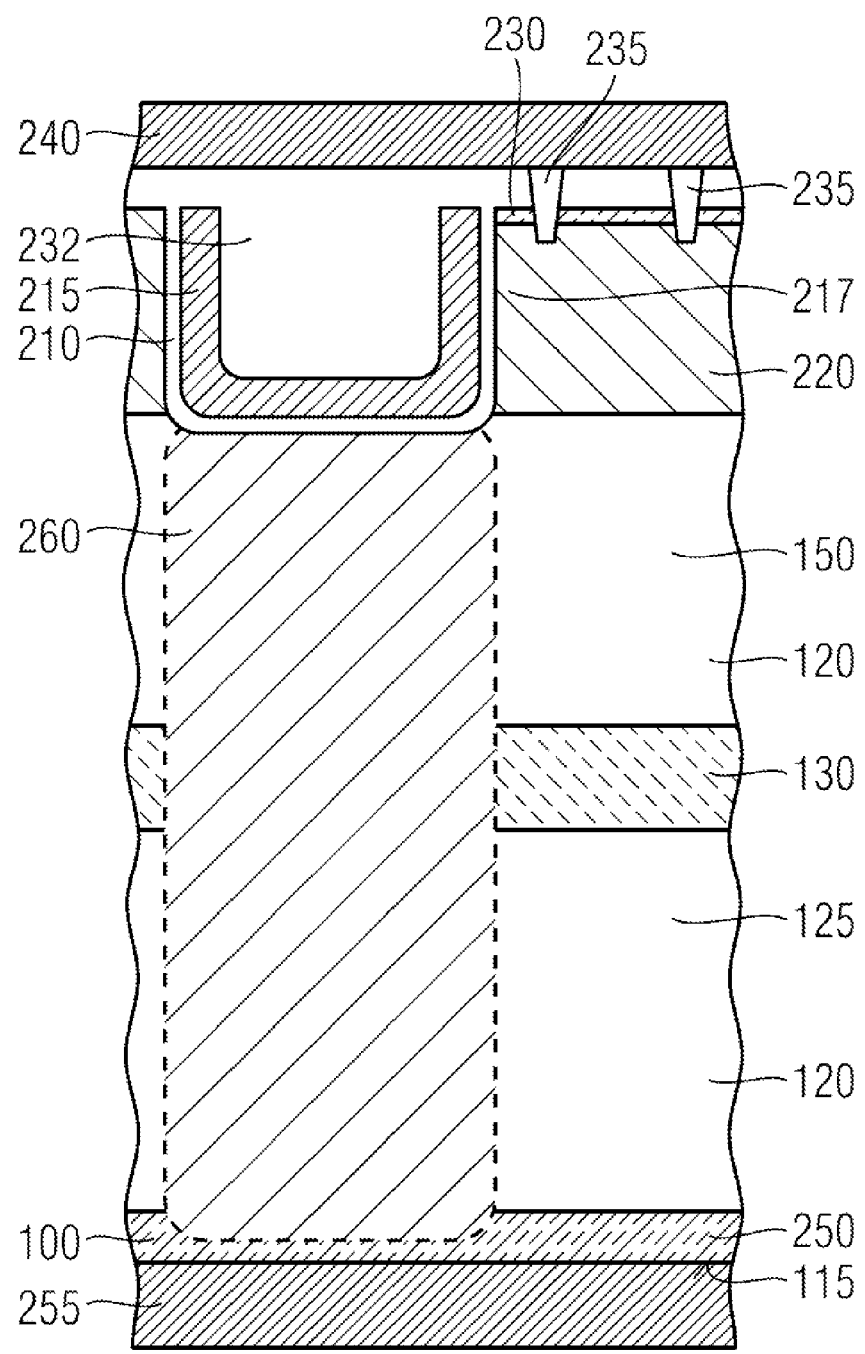

In accordance with the configuration shown in FIG. 2B, the trench (region) in which the gate electrode is to be formed can be filled with a layer stack containing a conducting layer, instead of being filled with a conducting filling. The trench (region) in which the gate electrode is to be formed can have a width of a plurality of μm, for example. In this case, it is difficult in terms of process engineering to introduce a conducting filling which completely fills the trench. In accordance with the configuration shown in FIG. 2B, after a gate dielectric 210 has been applied, the trench region is filled with a conformal doped polysilicon layer, which can have a suitable layer thickness, and then an insulating layer 232 composed of silicon oxide, for example.

In accordance with the embodiment shown in FIG. 2C, the trench region 214 in which the gate electrode is to be formed can have a smaller width than the drift zone region 260 at least at the location of the interface with the drift zone region 260. Furthermore, the trench region 214 can project right into the drift zone region. By way of example, the trench region 214 in which the gate electrode is to be formed can taper toward the drift zone region 260. This can be achieved by suitable selection of the parameters for etching said trench region. In the case of the embodiment shown in FIG. 2C, therefore, a part of the drift zone 260 adjoins the body region 220. Furthermore, a part 210b of the gate dielectric 210 can be formed with a greater thickness than other parts of the gate dielectric 210. By way of example, the part of the gate dielectric in the bottom region of the trench region 214 for the gate electrode is thicker than other parts. As a result thereof and as a result of the reduced width of the gate electrode on the side of the drain region, the gate-drain capacitance of the semiconductor device can be reduced further.

Figure 2D:
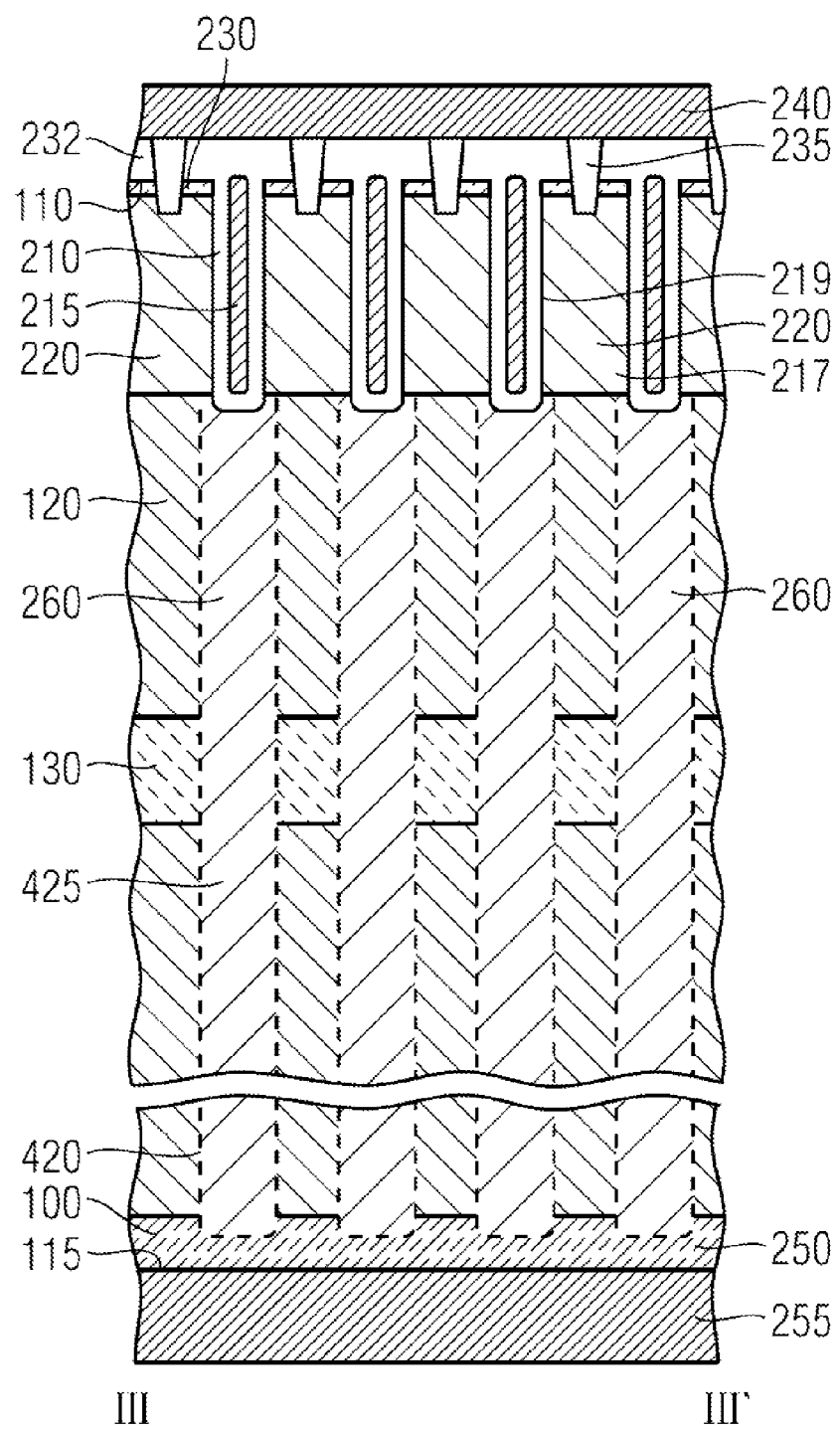

FIG. 2D shows a further embodiment of a semiconductor device, wherein the trench region 219 in which the gate electrode 215 is formed has a smaller width than the underlying drift zone region 260. As a result of such an arrangement, the width of the gate electrode on the side of the drain region is reduced, which leads to a reduction of the gate-drain capacitance.

In the case of the embodiments shown in FIGS. 1 and 2, the gate electrode 215 is arranged in each case in a self-aligned manner with respect to the drift zone regions 260 and is aligned with the latter.

Figure 3A:
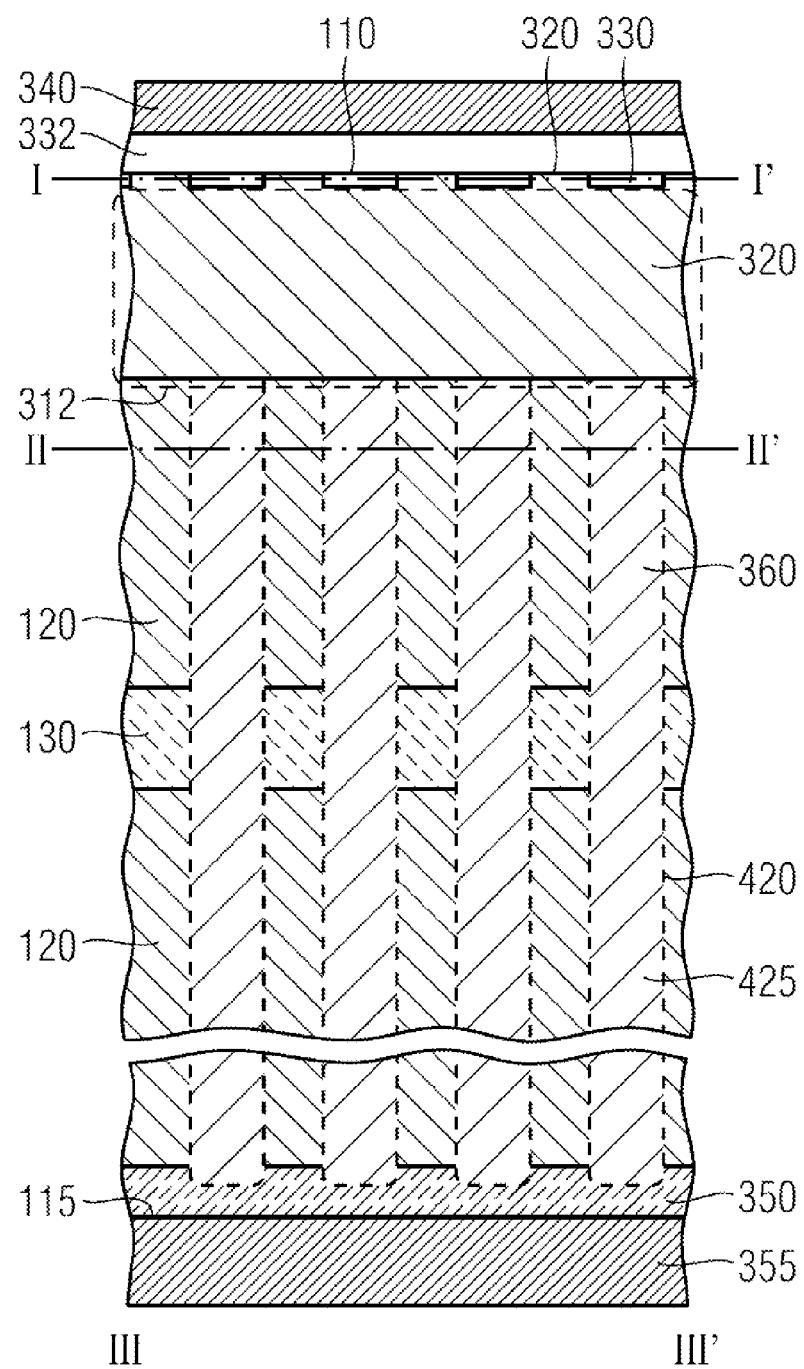
FIGS. 3A to 3D show cross-sectional views of a further embodiment of a semiconductor device.

In the case of the embodiment illustrated in FIG. 3A, the gate electrode 215 is arranged in gate trenches 312 extending perpendicularly to the drift zone region 260. As illustrated in FIG. 3A, the body regions 320 are arranged above the drift zone regions 260. The gate trenches 312 are arranged in front of or behind the plane of the drawing shown. The source regions 330 adjoining the first surface 110 are connected to the source electrode 340 via source contacts (not illustrated in this cross-sectional view). The position of the cross-sectional view between III and III' is evident from FIG. 3B.

Figure 3B:
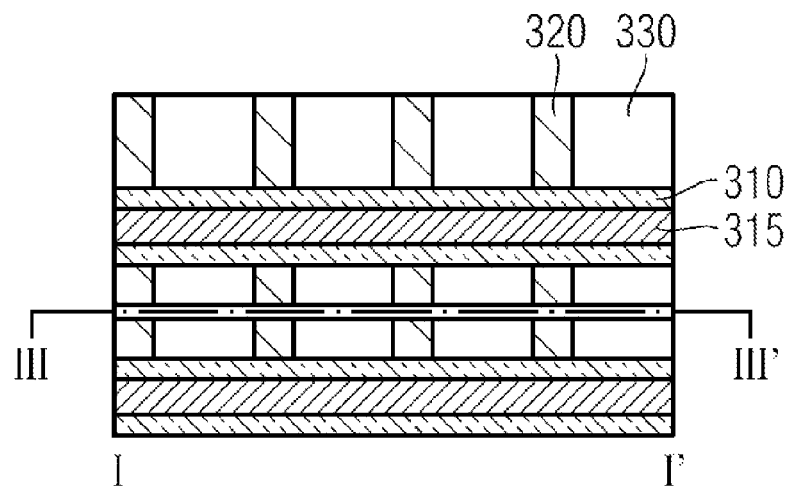

FIG. 3B shows a cross-sectional view of the illustration shown in FIG. 3A, wherein the cross-sectional view shown in FIG. 3B is established between I and I', as identified in FIG. 3A. As can be seen in FIG. 3B, the gate electrode 315 extends perpendicularly to the drift zone trenches 420. The source regions 330 and the body regions 320 can be arranged in each case in a striplike fashion, wherein the strips extend perpendicularly to the gate electrode 315.

Figure 3C:
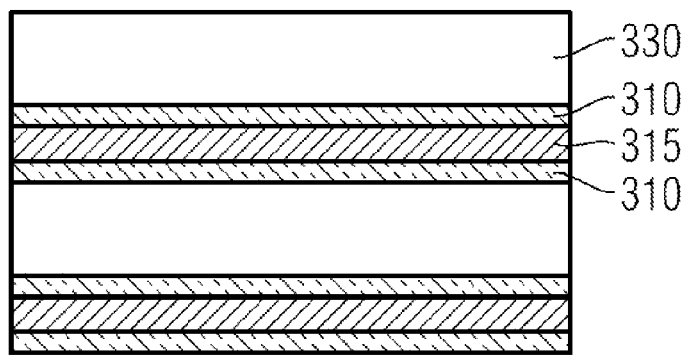
Figure 3D:
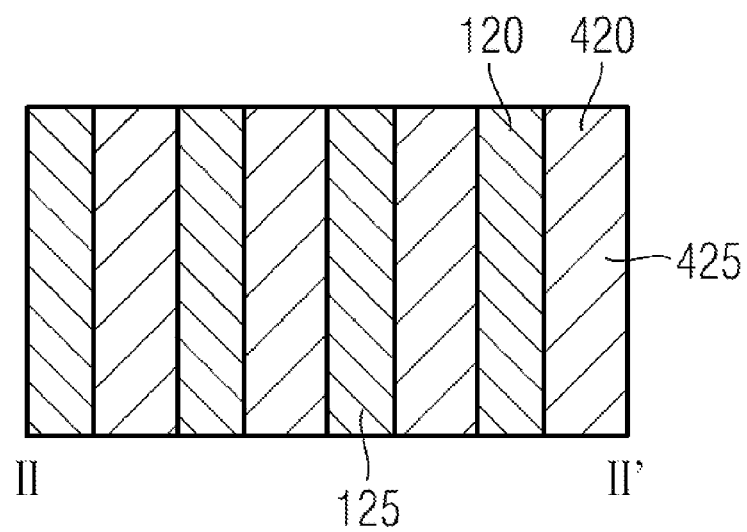

In accordance with the configuration shown in FIG. 3C, however, it is also possible for only the source regions 330 to adjoin the first surface 310. FIG. 3D shows a cross-sectional view of the structure between II and II', as is also shown in FIG. 3A. As can be seen, the drift zone regions 260 with the semiconductor material 425 are arranged alternately with respect to the webs 125.

A method for producing the semiconductor device shown in FIG. 1 will be described below. A monocrystalline semiconductor layer of the first conductivity type 120 is grown epitaxially above a substrate basic layer 100 of the second conductivity type. By way of example, the substrate basic layer 100 can be a heavily $n^+$-doped semiconductor wafer. Optionally, the substrate basic layer 100 can also be an $n^-$-doped semiconductor wafer, with a more highly doped region adjoining the second surface 115. A layer of the first conductivity type, for example p-doped silicon, is grown epitaxially on the first surface of the substrate basic layer 100. By way of example, the grown layer can have a layer thickness of 30 to 60 µm, for example 40 µm. Optionally, a more highly doped layer 130 can be provided within said layer 120. By way of example, the layer 130 can be produced by increasing the dopant concentration during the epitaxial growth. Alternatively, however, it is also possible to produce the layer 130 by targeted implantation. A combination of the two methods for setting a desired dopant concentration is also conceivable. In particular, using a photolithographically produced mask, an implementation method can be carried out in such a way that the region with the buried layer 130 is present only in the inner region of the cell array, while no buried doped layer 130 is present at the edge of the cell array. The buried doped layer 130 can be present approximately within the center of the epitaxially grown layer 120, but deviations upward or downward are also possible. A substrate 150 having a first surface 110 and a second surface 115 is present as a result. The first region 120 of the first conductivity type adjoins the first surface 110, and a region of the second conductivity type adjoins the second surface 115.

Figure 4A:
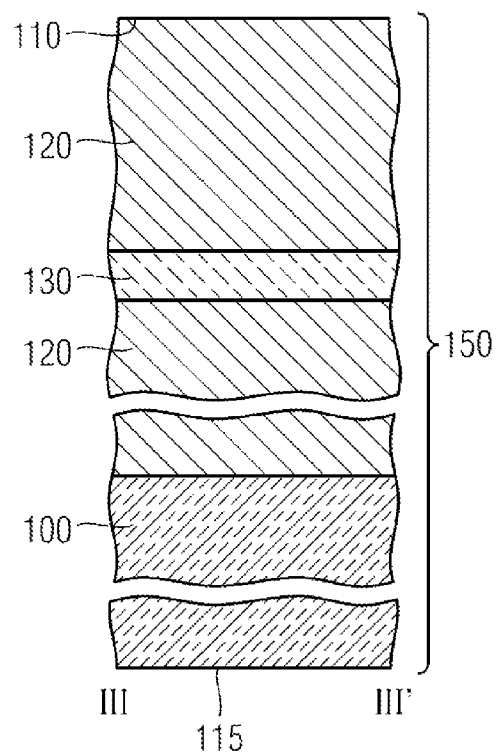
FIGS. 4A to 4I show cross-sectional views of a semiconductor substrate during the production of a semiconductor device in accordance with one exemplary embodiment.

FIG. 4A shows one example of a semiconductor substrate. A hard mask layer is subsequently formed above the first surface 110. The hard mask 410 can contain for example a silicon oxide layer or a silicon nitride layer or a combination of these layers. It goes without saying that other hard mask materials can also be used. The hard mask is patterned after a photoresist layer 420 has been applied. By way of example, the hard mask layer 410 can be patterned using a strip pattern. In this case, these strips can have a grid width of 0.5 µm to 10 µm. Openings between adjacent hard mask strips can have a width of approximately half a grid width. Correspondingly, a typical opening width between adjacent hard masks strips is approximately 200 nm to 5 µm.

Figure 4B:
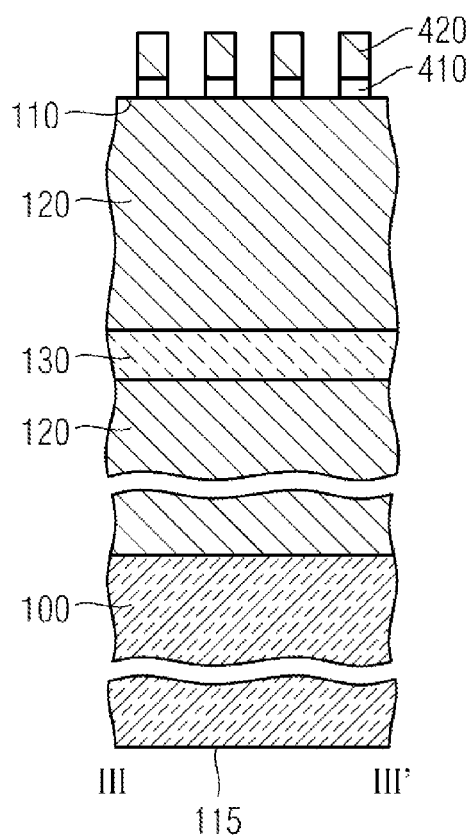
Figure 4C:
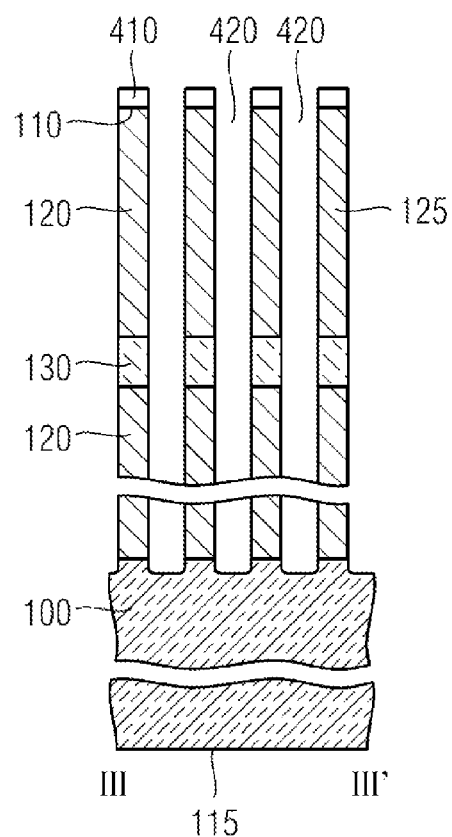

FIG. 4B shows a view of one example of a resulting structure. Next, drift zone trenches 420 are etched using the hard mask 410 as an etching mask. For example, a dry etching method, for example reactive ion etching, can be used as etching method. The etched drift zone trenches 420 have a depth of approximately 40 to 50 µm, which is customary for example for a reverse voltage of 600 V. The drift zone trenches 420 are etched such that they extend to the basic layer 100 and are connected thereto. The etching can be carried out in such a way that the bottom of the drift zone trenches is rounded, as is illustrated in FIG. 4C. This can be done for example by means of an isotropic etching toward the end of the etching method, by means of a surface treatment or by means of the formation of an oxide layer (e.g. by means of thermal oxidation) and a subsequent step for etching the deposited oxide layer. As described above, the drift zone trenches can be embodied in an arbitrary geometry, for example as holes having an arbitrary cross section, elongate holes or trenches which extend over a certain length in a second direction perpendicular to the cross-sectional view illustrated.

Semiconductor material of the second conductivity type is subsequently grown epitaxially in the drift zone trenches 420. In this case, the semiconductor material can either be applied by means of a selective epitaxy method, thereby preventing the epitaxially grown material from also growing on the hard mask layer 410. Alternatively, the semiconductor material can also be grown non-selectively. In this case, the semiconductor material above the hard mask layer 410 can subsequently be removed for example by means of a CMP method (chemical mechanical polishing). The semiconductor material of the second conductivity type is doped in situ during growth. In this case, the dopant concentration is set to be lower than the dopant concentration of the basic layer 100. The layer within the drift zone trenches 420 can be grown with varying dopant concentration, wherein the dopant concentration is set in a targeted manner so as to result in a predefined doping profile. In accordance with one example, firstly a more highly doped layer can be deposited conformally and then a more lightly doped material can be filled in. This results in a horizontally varying dopant concentration. A horizontally varying dopant profile also results if, by way of example, after the conformal deposition of a semiconductor layer, an isotropic doping method such as PLAD (plasma assisted doping), for example, is carried out, which sets a dopant concentration on the trench wall, and a material having a lower dopant concentration is then filled in. In accordance with a further example, in a lower trench region, too, the dopant concentration can be higher than in an upper trench region. As a result, it is possible to compensate for variations of the trench width that can arise for example as a result of the etching method. Overall, the dopant concentration should be dimensioned such that after the compensation of the charge carriers in the drift zone 260 by charge carriers of opposite polarity of the adjoining first region 120, the remaining number of charge carriers in the drift zone 260, that is to say the depletion charge, leads to a breakdown voltage corresponding to the voltage class.

Figure 4D:
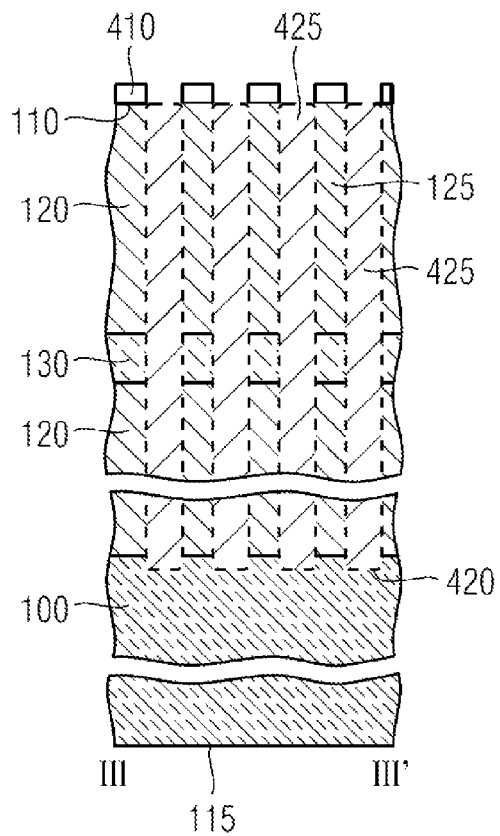

FIG. 4D shows a cross-sectional view of one example of the resulting structure. As is shown, the drift zone trenches 420 are now filled with semiconductor material 425 of the second conductivity type and form drift zone regions 260. Webs 125 formed from semiconductor material of the first conductivity type are arranged between adjacent drift zone trenches 420. In order to form the gate electrodes in accordance with the embodiment illustrated in FIG. 1A, the upper part of the trench filling 425 is subsequently etched back. In this case, residues of the patterned hard mask 410 are still present on the first surface 110 of the semiconductor substrate 150. The trench opening 430 can be formed to a depth of 0.5 to 2 µm.

Figure 4E:
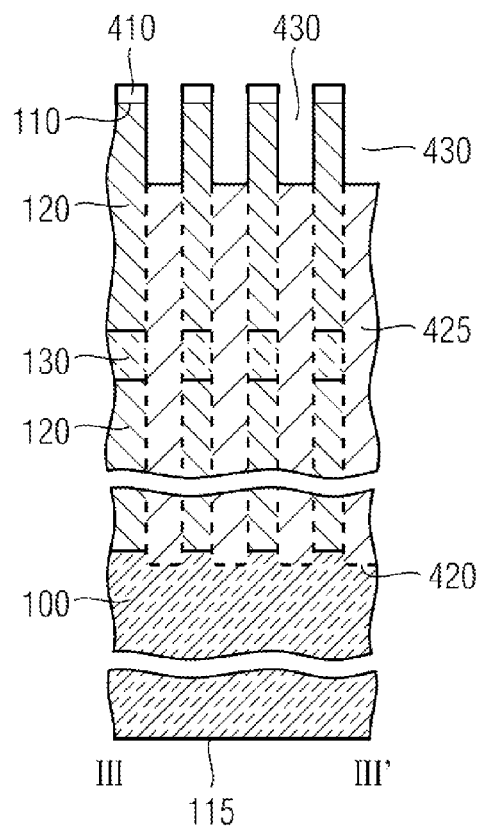

FIG. 4E shows one example of a resulting structure.

In accordance with further configurations of the method, the etching-back method can contain an isotropic etching step or a thermal oxidation step followed by etching back the oxide. As a result, it is possible to expand the upper trench region in order to form the expanded trench region 213. In accordance with a further embodiment, the etching parameters can be set such that the resulting trench region 214, at the location at which it contacts the drift zone trench 420, has a smaller diameter than the drift zone trench. By way of example, the trench region 214 can taper toward the drift zone trench. The subsequent ion implantation step for forming the body region 220 compensates for doping profiles in the adjoining web 125, as is illustrated for example in FIG. 2C.

In accordance with a further configuration, for producing the embodiment shown in FIG. 2D, proceeding from FIG. 4D, it is possible to form spacers made from a suitable material, for example a material that can be etched selectively with respect to the material of the hard mask 410, for example by conformal deposition of this material and a subsequent anisotropic etching step. The diameter of the openings exposed by the resulting hard mask 410 is reduced as a result. An etching step for producing the trench opening 430 can subsequently be carried out using this hard mask. The later doping step for defining the body regions 220 compensates for undesired doping profiles adjoining the resulting trench opening.

In order to produce the embodiment shown in FIG. 3A, alternatively, the residues of the hard mask 410 can be removed and trenches extending perpendicularly to the drift zone trenches 420 can subsequently be defined lithographically. An etching can subsequently be carried out analogously to the etching method shown in FIG. 4E. The subsequent steps for producing the gate electrode are identical in this case.

A gate dielectric 210 is subsequently formed, for example by means of thermal oxidation. The layer thickness of the gate dielectric 210 can be 10 to 100 nm. A conducting material is subsequently filled into the trench opening 430, for example doped polysilicon. A lithographic step is subsequently carried out in order to pattern the deposited polysilicon. Alternatively, the polysilicon can also be etched back without being patterned.

Figure 4F:
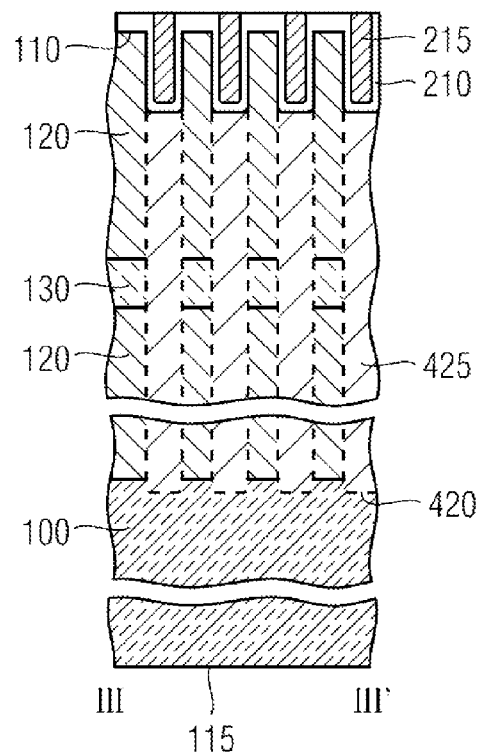

FIG. 4F shows a cross-sectional view of a resulting structure. As is shown, the gate electrodes 215 are now arranged at the upper regions of the drift zone trenches 420.

An ion implantation method for forming the body regions 220 is subsequently carried out. The body regions 220 can alternatively also be formed in other processing stages. By way of example, they can be formed before the etching back of the monocrystalline material 425 in the drift zone trenches 420 or else before the etching of the drift zone trenches. The exact point in time can be chosen according to the requirements imposed by the specific semiconductor device. In this case, these regions are doped with dopants of the first conductivity type in order to provide a higher dopant concentration than in the region 120. A corresponding doping step is also carried out for producing the structure shown in FIG. 3. Since the dopant concentration of the body region 220, 320 is significantly higher than the dopant concentration of the semiconductor material 425, the doping within the trenches 420 is covered by the doping of the body region 320.

Figure 4G:
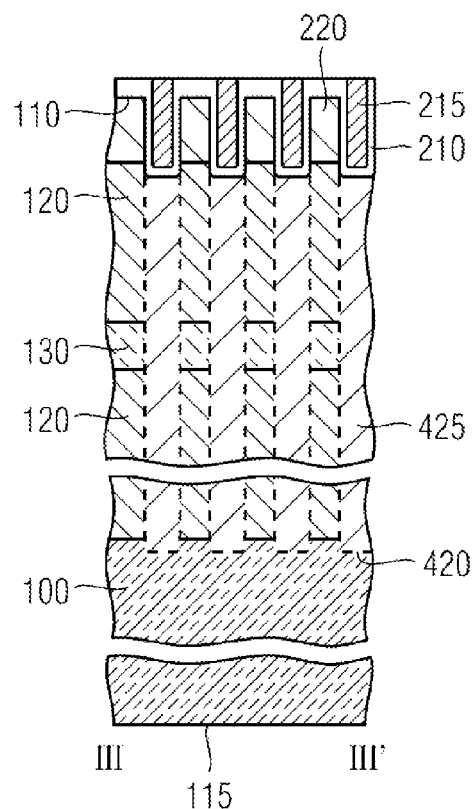
Figure 4H:
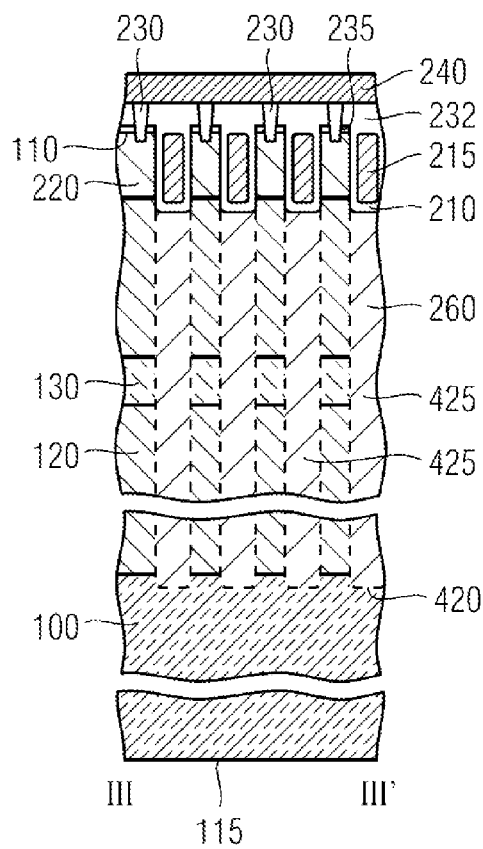

FIG. 4G shows a cross-sectional view of a resulting structure. The process steps conventionally used are subsequently carried out in order to form the source region 230. By way of example, an ion implantation method can be carried out in order to form the source regions 230 at the first surface 110. An insulating layer 232, for example silicon dioxide, can subsequently be deposited. After source contacts 235 have been formed in a customary manner, it is possible to apply a metallization layer 240 for producing the source electrode 240. FIG. 4H shows a cross-sectional view of a resulting structure.

Figure 4I:
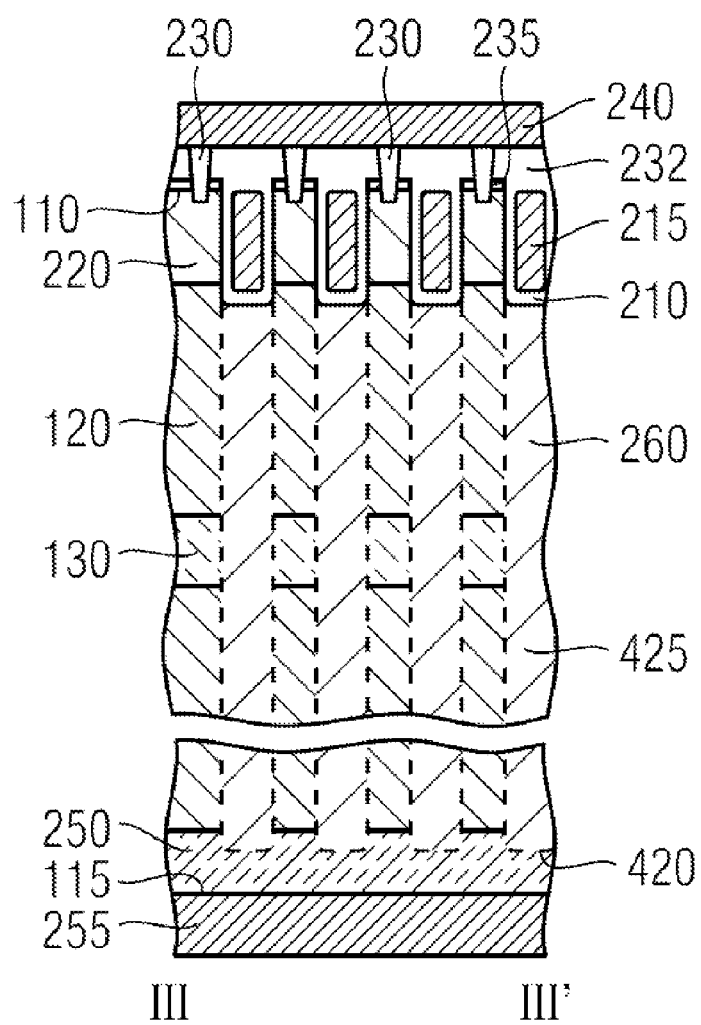

The rear side of the semiconductor device is then processed further. If appropriate, steps for wafer thinning can be carried out. If appropriate, it is possible to carry out an ion implantation step for improving the contact. Furthermore, a rear-side metallization can be applied, which forms the drain electrode 255. FIG. 4I shows a cross-sectional view of a resulting structure.

Figure 5:
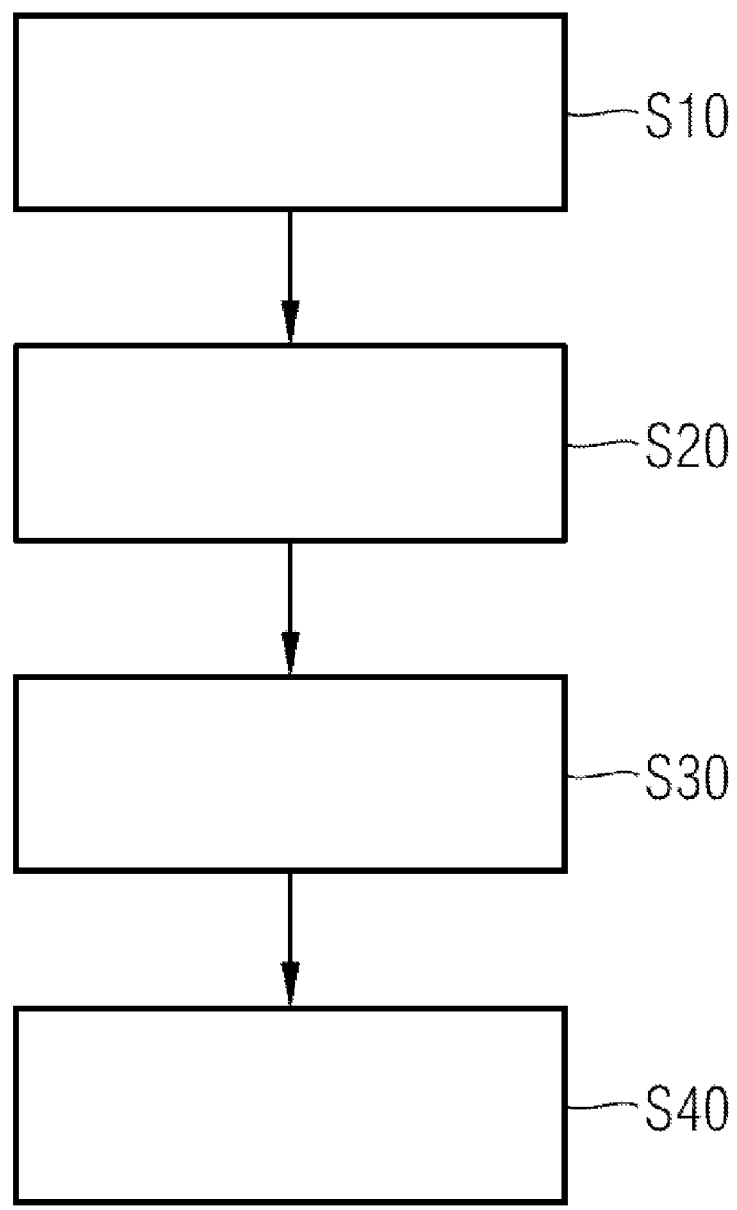
FIG. 5 shows a flow chart for illustrating a method for producing a semiconductor device in accordance with one embodiment.

FIG. 5 shows a flow chart of a method in accordance with one embodiment.

A method for producing a semiconductor device comprises forming (S10) a multiplicity of drift zone trenches 420 in a first surface 110 of a semiconductor substrate 150 having a first region 120 of a first conductivity type and a body region 220 of the first conductivity type, wherein the drift zone trenches 420 are formed such that they extend in a first direction having a component perpendicular to the first surface 110, introducing (S20) semiconductor material 425 of a second conductivity type in the drift zone trenches 420, wherein the second conductivity type is different than the first conductivity type, forming (S30) a gate electrode 215 arranged in a trench in the substrate 150. The method can furthermore comprise forming (S40) a drain region 250 and electrically connecting the drain region 250 to the semiconductor material 425 of the second conductivity type in the drift zone trenches 420.

As has been shown, the method described makes it possible to realize a semiconductor device, in particular a superjunction semiconductor device, with reasonable process complexity and low process costs. By virtue of the fact that the drift zone and the gate electrode are formed in a common drift zone trench in accordance with one embodiment, the method can be realized in a simple and cost-effective manner and very robustly. Furthermore, it is possible in this case to form the gate electrode in a self-aligned manner with respect to the drift zone.

The invention claimed is:
1. A semiconductor device, comprising:
   a semiconductor substrate
      comprising first regions of a first conductivity type and body regions of the first conductivity type, which are arranged respectively in a manner adjoining the first region and overlap the latter in each case on a side of the first region which faces a first surface of the semiconductor substrate, and comprising a multiplicity of drift zone regions arranged between the first regions and composed of a semiconductor material of a second conductivity type, which is different than the first conductivity type, wherein the first regions and the drift zone regions are arranged alternately and form a superjunction structure, a gate electrode formed in a trench in the semiconductor substrate; and a source electrode connected to the body region of the semiconductor substrate via a source contact that extends from the source electrode into a source region and then into the body region of the semiconductor substrate, wherein in each case a channel region is arranged in the body region adjacent to the gate electrode, and wherein the channel region is arranged in a manner horizontally offset relative to the drift zone region.

2. The semiconductor device as claimed in claim 1, wherein the channel region is electrically insulated from the gate electrode and is arranged in each case adjacent to the semiconductor material of the second conductivity type in the drift zone regions.

3. The semiconductor device as claimed in claim 2, wherein the channel region overlaps the first region.

4. The semiconductor device as claimed in claim 1, wherein the drift zone regions are producible by forming drift zone trenches in the semiconductor substrate and filling the drift zone trenches with semiconductor material of the second conductivity type.

5. The semiconductor device as claimed in claim 1, wherein the drift zone regions furthermore extend in a second direction parallel to the first surface of the semiconductor substrate.

6. The semiconductor device as claimed in claim 1, wherein the gate electrode is arranged in each case in a trench in a self-aligned manner with respect to the drift zone region and the drift zone region is arranged in each case below the gate electrode.

7. The semiconductor device as claimed in claim 5, wherein the trench region in which the gate electrode is arranged has a larger width than the drift zone region.

8. The semiconductor device as claimed in claim 5, wherein the trench region in which the gate electrode is arranged has a smaller width than the drift zone region.

9. The semiconductor device as claimed in claim 1, further comprising gate trenches which are formed in the semiconductor substrate and in which the gate electrode is arranged, wherein the gate trenches extend perpendicularly to the drift zone regions.

10. The semiconductor device as claimed in claim 1, wherein in each case the gate electrode is arranged in a trench region which is connected to the drift zone region and which tapers toward the drift zone region and extends right into the latter.

11. The semiconductor device as claimed in claim 1, further comprising a region of the first conductivity type which is buried in the first region and which is doped more highly than the first region.

12. An integrated circuit, comprising the semiconductor device as claimed in claim 1.

13. A method for producing a semiconductor device, comprising:

forming via a first etch, a plurality of drift zone trenches in a first surface of a semiconductor substrate having a first region of a first conductivity type and a body region of the first conductivity type, wherein the drift zone trenches are formed such that they extend in a first direction having a component perpendicular to the first surface, filling an entirety of the drift zone trenches with a semiconductor material of a second conductivity type, which is different than the first conductivity type, for the purpose of forming drift zone regions, forming via a second etch, a trench in each of the drift zone trenches, wherein the semiconductor material of the second conductivity type is etched from an upper portion of each of the drift zone trenches; and forming a gate electrode arranged in each case in the trench formed in the drift zone trenches.

14. The method as claimed in claim 13, further comprising forming buried regions which are buried within the first region and have a higher dopant concentration of the first conductivity type than the first region.

15. The method as claimed in claim 13, wherein the drift zone trenches are formed with a widened trench region adjoining the first surface and the gate electrode is formed in each case in said widened trench region.

16. The method as claimed in claim 13, wherein in each case the gate electrode is formed in a trench region which is connected to the drift zone trench and which tapers toward the drift zone trench and extends right into the latter.

17. The method as claimed in claim 13, wherein the drift zone trenches are formed with a narrowed trench region adjoining the first surface and the gate electrode is formed in each case in said narrowed trench region.

18. The method as claimed in claim 13, further comprising forming gate trenches in the semiconductor substrate, the gate electrode being formed in said gate trenches, wherein the gate trenches extend perpendicularly to the drift zone trenches.

19. The method as claimed in claim 13, wherein a dopant concentration of the second conductivity type is set in a targeted manner in the drift zone trenches in order to achieve a predefined doping profile.

20. The method as claimed in claim 13, further comprising forming source contacts that extend from source electrodes into a source region and then into the body region of the semiconductor substrate.

* * * * *